(12) United States Patent
Wang

(10) Patent No.: US 11,315,888 B2
(45) Date of Patent: Apr. 26, 2022

(54) ARRAY SUBSTRATE, DISPLAY PANEL, AND MANUFACTURING METHOD OF ARRAY SUBSTRATE

(71) Applicant: WUHAN CHINA STAR OPTOELECTRONICS TECHNOLOGY CO., LTD., Hubei (CN)

(72) Inventor: Donglei Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 143 days.

(21) Appl. No.: 16/756,151

(22) PCT Filed: Mar. 17, 2020

(86) PCT No.: PCT/CN2020/079624
§ 371 (c)(1),
(2) Date: Apr. 15, 2020

(87) PCT Pub. No.: WO2021/155626
PCT Pub. Date: Aug. 12, 2021

(65) Prior Publication Data
US 2021/0407933 A1    Dec. 30, 2021

(30) Foreign Application Priority Data

Feb. 4, 2020   (CN) .......................... 202010079497.6

(51) Int. Cl.
*H01L 23/60*   (2006.01)
*H01L 27/12*   (2006.01)

(52) U.S. Cl.
CPC .......... *H01L 23/60* (2013.01); *H01L 27/1248* (2013.01); *H01L 27/1262* (2013.01)

(58) Field of Classification Search
CPC ....... H01L 23/60; H01L 27/12; H01L 27/124; H01L 27/126; H01L 27/1248; H01L 27/1262
USPC .......................................................... 257/72
See application file for complete search history.

(56) References Cited

U.S. PATENT DOCUMENTS

| 2017/0155066 | A1 | 6/2017 | Minami et al. |
| 2017/0194599 | A1 | 7/2017 | Furuie |
| 2017/0200750 | A1* | 7/2017 | Liu ........................ G02F 1/1339 |

FOREIGN PATENT DOCUMENTS

| CN | 105068373 A | 11/2015 |
| CN | 105514033 A | 4/2016 |
| CN | 107799473 A | 3/2018 |

* cited by examiner

*Primary Examiner* — Fazli Erdem
(74) *Attorney, Agent, or Firm* — Dickinson Wright PLLC

(57) ABSTRACT

The present disclosure provides an array substrate, a display panel, and a manufacturing method of the array substrate. The display panel includes the array substrate. The array substrate includes a planarization layer provided with a groove surrounding a display area in a non-display area, the groove includes a bottom surface and two side inclined planes, and an included angle (taper angle) between the bottom surface and the side inclined planes ranges from 30° to 45°. When manufacturing the groove, a plurality of side inclined sub-planes are manufactured at intervals and connected to each other to form the side inclined planes.

8 Claims, 3 Drawing Sheets

ARRAY SUBSTRATE, DISPLAY PANEL, AND MANUFACTURING METHOD OF ARRAY SUBSTRATE

FIELD OF INVENTION

The present disclosure relates to the field of display technologies, and more particularly, to an array substrate, a display panel, and a manufacturing method of the array substrate.

BACKGROUND OF INVENTION

Based on design requirements of low temperature polysilicon display panels, as shown in FIG. 1, which is a schematic structural diagram of a display panel in current technology, an organic planarization layer 91 is disposed at an outer periphery of the display panel. Because a film layer of the organic planarization layer 91 is thicker, a general condition thereof in the industry is 2 um to 3 um, and a groove 92 is prone to have residue of subsequent film layers, such as indium tin oxide. Residual indium tin oxide 93 shortens a spacing distance to a metal of an array substrate 94, and the residual indium tin oxide 93 is prone to produce electrostatic discharge with the metal of the array substrate 94, which causes blast and injury.

After analysis, it can be found that a thickness of a photoresist layer in the groove of the organic planarization layer is thicker than a thickness of the photoresist layer on a normal position during a patterning process when manufacturing an indium tin oxide layer. The thickness of the photoresist layer on a general normal position is 1.5 um, while the thickness of the photoresist layer reaches to 2.8 um in the groove, which causes it to be unable to wash off all of the photoresist during development and causes indium tin oxide in the groove to be unable to be removed completely due to protection of the photoresist when patterning to etch the photoresist layer.

Through the phenomenon described above, it is not difficult to analyze the real reason for the indium tin oxide residue. That is, a thicker organic planarization layer causes an obvious accumulation in the groove thereof when coating a photoresist, which further causes the photoresist layer in the groove to be unable to be effectively inducted and completely removed by a matching condition for exposure and development.

At present, a tilt angle (taper angle) of the groove ranges from around 45° to 60°. Accumulation of photoresist at both sides of a groove bottom can be reduced if the tilt angle is decreased, thereby fundamentally reducing metal residue formed at both sides of the groove bottom of the organic planarization layer.

Technical problem: an objective of the present disclosure is to provide an array substrate, a display panel, and a manufacturing method of the array substrate to solve the problem that a photoresist accumulated in a bottom of a retaining wall is thicker and is hard to be effectively removed by exposure and development in an exposure process, which causes residual photoresist. Therefore, the present disclosure prevents metal residue from forming at both sides of the groove bottom of the organic planarization layer and producing electrostatic discharge which causes blast and injury, and improves yield of the display panel.

SUMMARY OF INVENTION

To achieve the above objective, the present disclosure provides an array substrate which comprises a planarization layer having a display area and a non-display area and provided with a groove surrounding the display area in the non-display area, wherein the groove comprises a bottom surface and side inclined planes disposed at both sides of the bottom surface; wherein, an included angle (taper angle) between the bottom surface and the side inclined planes ranges from 30° to 45°.

Further, the included angle between the bottom surface and the side inclined planes ranges from 30° to 35°.

An embodiment of the present disclosure further provides a manufacturing method of an array substrate. The method comprises following steps:

manufacturing a planarization layer defined with a display area and a non-display area; and manufacturing a groove on the planarization layer in the non-display area, wherein the groove is positioned surrounding the display area and comprises a bottom surface and side inclined planes disposed at both sides of the bottom surface, and an included angle between the bottom surface and the side inclined planes ranges from 30° to 45°;

wherein when manufacturing the groove, a plurality of side inclined sub-planes are manufactured at intervals and connected to each other to form the side inclined planes.

Further, a length of the side inclined sub-planes connected to the bottom surface ranges from 1.3 um to 1.5 um.

Further, a spacing distance between any two adjacent side inclined sub-planes ranges from 1.0 um to 1.4 um.

Further, any two adjacent side inclined sub-planes are arranged at equal intervals.

Further, a contour of the side inclined sub-planes is one or more of a triangular, rectangular, or trapezoidal shape.

Further, a height of the contour of the side inclined sub-planes ranges from 10 um to 15 um.

Further, the contour of the side inclined sub-planes is isosceles trapezoidal including a topline, a baseline, and two legs, and the topline or the baseline is connected to the bottom surface.

Further, a length of the topline ranges from 1.0 um to 1.2 um, and a length of the baseline ranges from 1.3 um to 1.4 um.

The present disclosure further provides a display device which comprises the above array substrate.

Beneficial effect: the beneficial effect of the present disclosure is that the present disclosure provides an array substrate, a display panel, and a manufacturing method of the array substrate by manufacturing a plurality of side inclined sub-planes at equal intervals to form side inclined planes of a groove of an organic planarization layer. In the case where combined limit resolving power value of a mask aligner is 3.0 um, the side inclined planes having smooth planes can be manufactured under a situation of only having half resolution, and total amount of photoresist formed at both sides of a groove bottom is reduced, which decreases an included angle and solves the problem that the photoresist accumulated in a bottom of a retaining wall is thicker and is hard to be effectively removed by exposure and development in an exposure process, which causes residual photoresist. Therefore, the present disclosure prevents metal residue from forming at both sides of the groove bottom of the organic planarization layer and producing electrostatic discharge which causes blast and injury, and improves yield of the display panel.

DETAILED DESCRIPTION OF PREFERRED EMBODIMENTS

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

Figure 1:
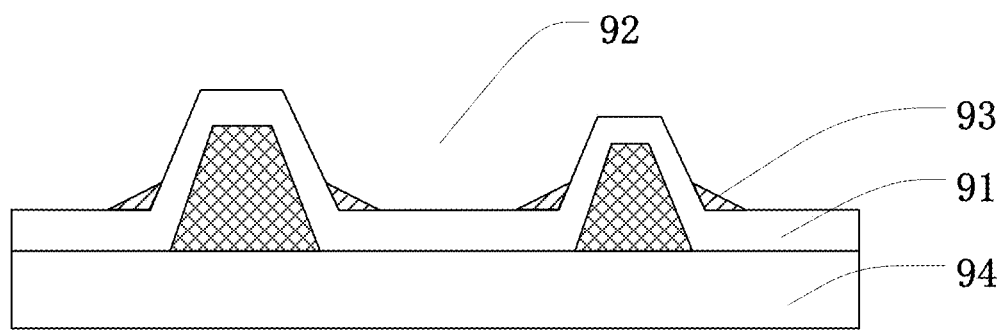
FIG. 1 is a schematic structural diagram of a display panel in current technology.
Figure 2:
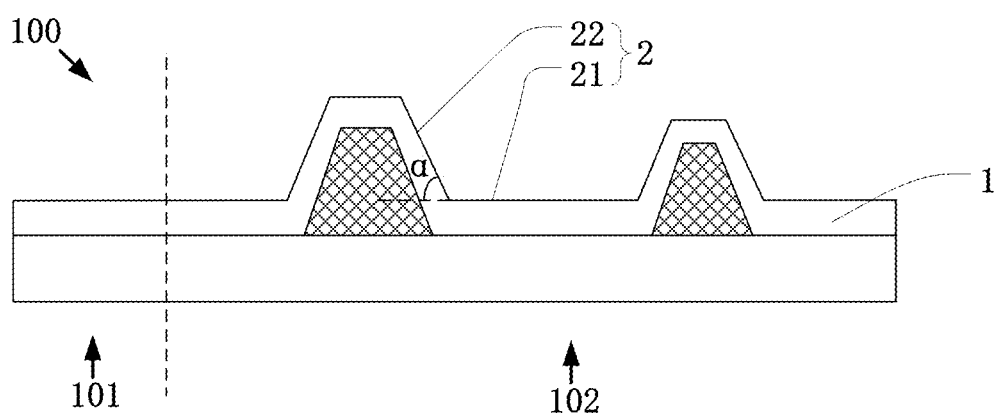
FIG. 2 is a schematic structural diagram of an array substrate according to an embodiment of the present disclosure.
Figure 3:
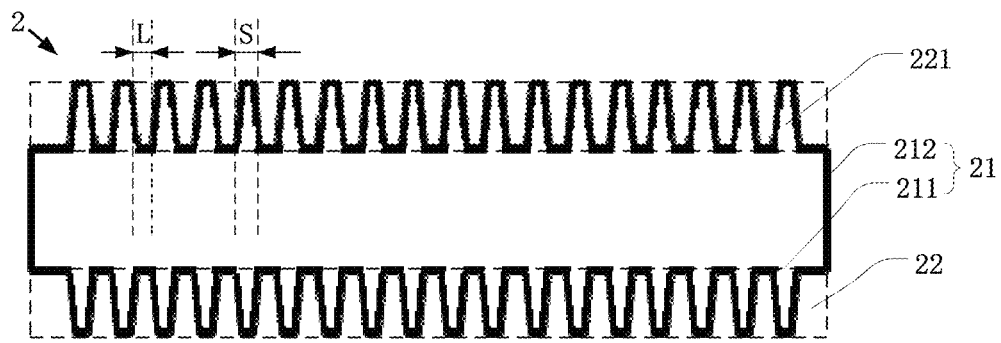
FIG. 3 is a schematic top view of a groove in FIG. 2.
Figure 4:
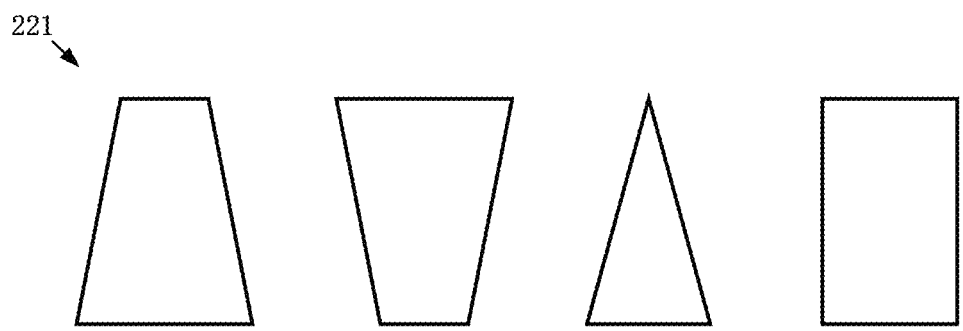
FIG. 4 is a schematic structural diagram of a contour of side inclined sub-planes according to an embodiment of the present disclosure.

As shown in FIG. 2, an embodiment of the present disclosure provides an array substrate 110. The array substrate 100 comprises a planarization layer 1 having a display area 101 and a non-display area 102, and the planarization layer 1 is provided with a groove 2 in the non-display area 102. As shown in FIGS. 3 and 4, the groove 2 comprises a bottom surface 21 and side inclined planes 22 disposed at both sides of the bottom surface 21. Wherein, an included angle α between the bottom surface 21 and the side inclined planes 22 ranges from 30° to 45°.

Wherein, the side inclined planes 22 are smooth planes. The side inclined planes 22 of the groove 2 are manufactured by manufacturing a plurality of side inclined sub-planes 221 at intervals, that is, a plurality of the side inclined sub-planes 221 are connected to each other to form the side inclined planes 22. Preferably, a contour of the side inclined sub-planes 221 is trapezoidal. It can be understood that a plurality of trapezoidal side inclined sub-planes 221 are connected to each other to constitute the side inclined planes 22, and because gaps thereof are small, the side inclined planes 22 formed by integrating the plurality of side inclined sub-planes 221 are smooth planes. The smooth planes can be observed by using devices, such as a microscope.

In an embodiment of the present disclosure, the included angle between the bottom surface and the side inclined planes ranges from 30° to 35°.

Figure 5:
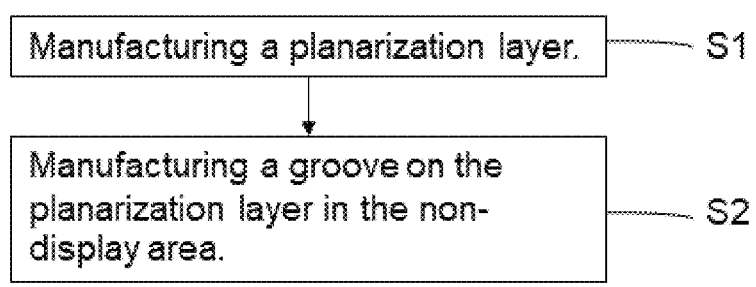
FIG. 5 is a flowchart of a manufacturing method of an array substrate according to an embodiment of the present disclosure.

As shown in FIG. 5, an embodiment of the present disclosure further provides a manufacturing method of an array substrate 100. The method comprises following steps:

S1: manufacturing a planarization layer 1 defined with a display area 101 and a non-display area 102; and S2: manufacturing a groove 2 on the planarization layer 1 in the non-display area 102, wherein the groove 2 is positioned surrounding the display area 101 and comprises a bottom surface 21 and side inclined planes 22 disposed at both sides of the bottom surface 21, wherein the side inclined planes 22 are smooth planes, and an included angle between the bottom surface 21 and the side inclined planes 22 ranges from 30° to 45°.

Wherein, the groove 2 is manufactured by manufacturing a plurality of side inclined sub-planes 221 at intervals, that is, a plurality of the side inclined sub-planes 221 are connected to each other to form the side inclined planes 22. Preferably, a contour of the side inclined sub-planes 221 is trapezoidal. It can be understood that a plurality of trapezoidal side inclined sub-planes 221 are connected to each other to constitute the side inclined planes 22, and because gaps thereof are small, the side inclined planes 22 formed by integrating the plurality of side inclined sub-planes 221 are smooth planes. The smooth planes can be observed by using devices, such as a microscope.

In the case where combined limit resolving power value of a mask aligner is 3.0 um, the embodiment of the present disclosure manufactures a plurality of side inclined sub-planes 221 by blur exposure, thereby forming the side inclined planes 22 having smooth planes and decreasing the included angle α. The embodiment not only ensures a smooth state of the groove 2, but also effectively decreases the included angle α from 45° to around 30°. Therefore, a purposed blur exposure can be achieved by designing the resolution around 43% to 46% of the limit resolution of the mask aligner, which can effectively decrease the included angle α and ensure no residual photoresist at both sides of the groove 2 bottom, thereby effectively relieving the phenomenon of producing electrostatic discharge which causes blast and injury, which is caused by metal residue formed at both sides of the groove 2 bottom of the organic planarization layer due to residual photoresist, and improving the yield of the display panel.

In an embodiment of the present disclosure, the bottom surface 21 is a rectangular ring shape. The bottom surface 21 comprises long sides 211 along an extending direction of the bottom surface 21. It can be understood that the display area 101 is rectangular, so the bottom surface 21 disposed surrounding the display area 101 is a rectangular ring shape, that is, the bottom surface 21 is disposed continuously surrounding periphery of entire array substrate 100 in the non-display area 102. Areas of each side of the display area 101 surrounded by the bottom surface 21 can be divided into rectangular planes, which comprises the long sides 211 and width sides 212 perpendicular to the long sides 211. The side inclined planes 22 are connected to the bottom surface 21, and one side of the side inclined sub-planes 221 is connected to the bottom surface 211.

As shown in FIG. 3, in an embodiment of the present disclosure, a length S of the side inclined sub-planes 221 connected to the bottom surface 211 ranges from 1.3 um to 1.5 um, and preferably 1.3 um to 1.4 um. A spacing distance L between any two adjacent side inclined sub-planes 221 ranges from 1.0 um to 1.4 um, and preferably L is 1.3 um to 1.4 um. Preferably, any two adjacent side inclined sub-planes 221 are disposed at equal intervals. Because combined limit resolving power value of the mask aligner is 3.0 um, the limit resolving power value in the embodiment ranges from 1.0 um to 1.5 um, and preferably the limit resolving power value ranges from 1.3 um to 1.4 um. Therefore, a purposed blur exposure can be achieved by designing the resolution around 43% to 46% of the limit resolution of the mask aligner. The embodiment of the present disclosure manufactures a plurality of side inclined sub-planes 221 by blur exposure, thereby forming the side inclined planes 22 having smooth planes, which not only ensures a smooth state of the groove 2, but also effectively decreases the included angle α from 45° to around 30°. The present disclosure effectively relieves the phenomenon of producing electrostatic discharge which causes blast and injury, caused by metal residue formed at both sides of the groove 2 bottom of the organic planarization layer due to residual photoresist, and improves the yield of the display panel by effectively decreasing the included angle α and ensuring no residual photoresist at both sides of the groove 2 bottom.

As shown in FIG. 4, a contour of the side inclined sub-planes 221 is one or more of a triangular, rectangular, or trapezoidal shape.

In the embodiment of the present disclosure, a height of the contour of the side inclined sub-planes 221 ranges from 10 um to 15 um, that is, a height of the side inclined planes 22 ranges from 10 um to 15 um.

In the embodiment of the present disclosure, the contour of the side inclined sub-planes 221 is isosceles trapezoidal including a topline, a baseline, and two legs, and the topline or the baseline is connected to the bottom surface 21.

In the embodiment of the present disclosure, a length of the topline ranges from 1.0 um to 1.2 um, and a length of the baseline ranges from 1.3 um to 1.4 um.

In verification of blur exposure in the embodiment, the blur exposure has a designed resolution of around 40% to 50% of a limit resolution of a mask aligner. Specifically, the embodiment uses a resolution ranging from 43% to 46% of the limit resolution of Nikon FX-66s mask aligner, and the best designed limit resolving power value of blur exposure ranges from (3 um*43%) to (3 um*46%), that is, 1.3 um to 1.4 um. In addition, if the embodiment uses a resolution ranging from 40% to 50% of the limit resolution of Nikon FX-68 mask aligner having a limit resolving power value of 1.5 um, and a theoretical designed limit resolving power value of blur exposure ranges from (1.5 um*40%) to (1.5 um*50%), that is, 0.6 um to 0.75 um.

A total of 11 experiments are designed on the product, wherein, the spacing distance L between any two adjacent side inclined sub-planes 221 is 1.0 um, and the length S of the side inclined sub-planes 221 connected to the bottom surface 211 ranges from 1.0 um to 2.0 um, obtaining the result that when L≤1.5 um and S≤1.5 um, a basic configuration of the groove 2 can be ensured.

Figure 6:
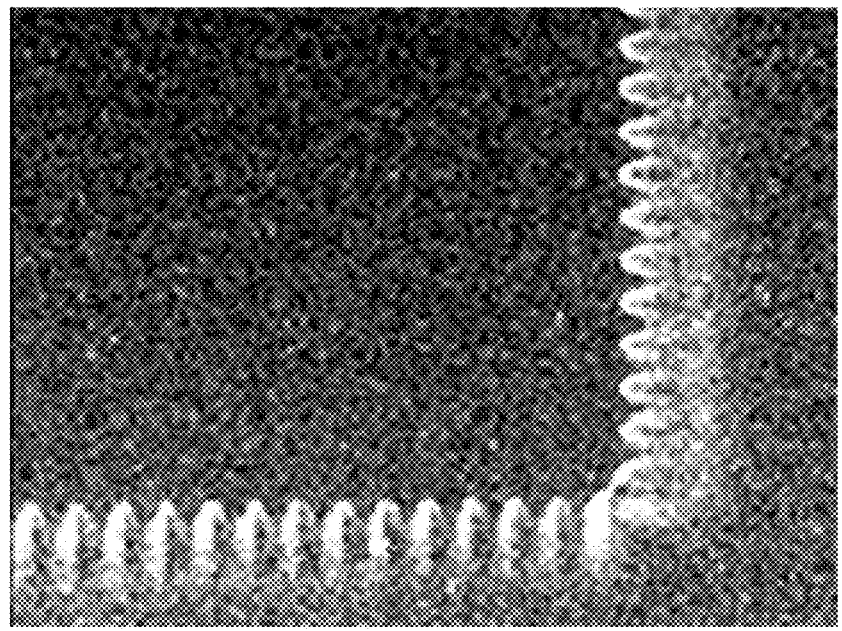
FIG. 6 is a top-view picture of a groove after manufacturing when L=S=2.0 um according to an embodiment of the present disclosure.

As shown in FIG. 6, FIG. 6 is a top-view picture of the groove 2 after manufactured when L=S=2.0 um, which is obviously jagged, and an included angle α thereof is decreased to around 20°.

Figure 7:
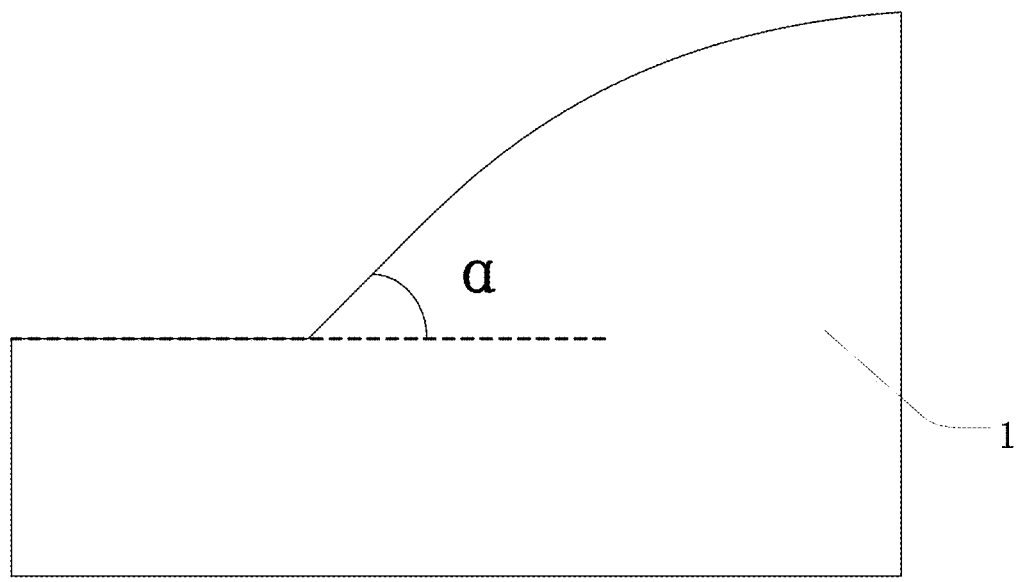
FIG. 7 is a schematic cross-sectional diagram of a groove when L=S=1.0 um according to an embodiment of the present disclosure.

As shown in FIG. 7, FIG. 7 is a schematic cross-sectional diagram of a groove when L=S=1.0 um. An included angle α thereof is basically unchanged and maintains at 40° to 60°. The groove 2 is in a smooth state and an edge of the side inclined planes 22 connected to the bottom surface 211 is flush.

In summary, the length of the side inclined sub-planes 221 connected to the bottom surface 211 ranges from 1.3 um to 1.5 um, and preferably 1.3 um to 1.4 um. The spacing distance L between any two adjacent side inclined sub-planes 221 ranges from 1.0 um to 1.4 um. The embodiment not only ensures a smooth state of the groove 2, but also effectively decreases the included angle α from 45° to around 30°. Therefore, a purposed blur exposure can be achieved by designing the resolution around 43% to 46% of the limit resolution of the mask aligner, which can effectively decrease the included angle α and ensure no residual photoresist at both sides of the groove 2 bottom, thereby effectively relieving the phenomenon of producing electrostatic discharge which causes blast and injury, caused by metal residue formed at both sides of the groove 2 bottom of the organic planarization layer due to residual photoresist, and improving the yield of the display panel.

In the embodiment of the present disclosure, the contour of the side inclined sub-planes 221 is one or more of a triangular, rectangular, or trapezoidal shape.

In the embodiment of the present disclosure, a height of the contour of the side inclined sub-planes 221 ranges from 10 um to 15 um, that is, a height of the side inclined planes 22 ranges from 10 um to 15 um.

In the embodiment of the present disclosure, the contour of the side inclined sub-planes 221 is isosceles trapezoidal including a topline, a baseline, and two legs, and the topline or the baseline is connected to the bottom surface 21.

In the embodiment of the present disclosure, a length of the topline ranges from 1.0 um to 1.2 um, and a length of the baseline ranges from 1.3 um to 1.4 um.

The present disclosure further provides a display device which comprises the above array substrate 100.

The beneficial effect of the present disclosure is that the present disclosure provides an array substrate, a display panel, and a manufacturing method of the array substrate by manufacturing a plurality of side inclined sub-planes at equal intervals to form side inclined planes of a groove of an organic planarization layer. In the case where combined limit resolving power value of a mask aligner is 3.0 um, the side inclined planes having smooth planes can be manufactured under a situation of only having half resolution, and total amount of photoresist formed at both sides of a groove bottom is reduced, which decreases an included angle α and solves the problem that the photoresist accumulated in a bottom of a retaining wall is thicker and is hard to be effectively removed by exposure and development in an exposure process, and causes residual photoresist. Therefore, the present disclosure prevents metal residue from forming at both sides of the groove bottom of the organic planarization layer, which produces electrostatic discharge and causes blast and injury, and improves yield of the display panel.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A manufacturing method of an array substrate, comprising following steps:
   manufacturing a planarization layer defined with a display area and a non-display area; and
   manufacturing a groove on the planarization layer in the non-display area, wherein the groove is positioned surrounding the display area and comprises a bottom surface and side inclined planes disposed at both sides of the bottom surface, and an included angle between the bottom surface and the side inclined planes ranges from 30° to 45°; and
   wherein when manufacturing the groove, a plurality of side inclined sub-planes are manufactured at intervals and connected to each other to form the side inclined planes, a length of bottom sides of the side inclined sub-planes connected to the bottom surface ranges from 1.3 um to 1.5 um, and a spacing between the bottom sides of any two adjacent side inclined sub-planes ranges from 1.0 um to 1.4 um.

2. The manufacturing method of the array substrate according to claim 1, wherein a contour of the side inclined sub-planes is one or more of a triangular, rectangular, or trapezoidal shape.

3. The manufacturing method of the array substrate according to claim 2, wherein a height of the contour of the side inclined sub-planes ranges from 10 um to 15 um.

4. The manufacturing method of the array substrate according to claim 2, wherein the contour of the side inclined sub-planes is isosceles trapezoidal including a topline, a baseline, and two legs, and the topline or the baseline is connected to the bottom surface.

5. The manufacturing method of the array substrate according to claim 4, wherein a length of the topline ranges from 1.0 um to 1.2 um, and a length of the baseline ranges from 1.3 um to 1.4 um.

6. A display device, comprising the array substrate manufactured by the manufacturing method according to claim 1.

7. An array substrate, manufactured by the manufacturing method according to claim 1.

8. The array substrate according to claim 7, wherein the included angle between the bottom surface and the side inclined planes ranges from 30° to 35°.

* * * * *